(12) United States Patent
Khan et al.

(10) Patent No.: US 11,110,383 B2
(45) Date of Patent: *Sep. 7, 2021

(54) GAS ABATEMENT APPARATUS

(71) Applicant: Applied Materials, Inc., Santa Clara, CA (US)

(72) Inventors: Adib Khan, Cupertino, CA (US); Qiwei Liang, Fremont, CA (US); Sultan Malik, Sacramento, CA (US); Srinivas Nemani, Sunnyvale, CA (US); Rafika Smati, Santa Clara, CA (US); Joseph Ng, Santa Clara, CA (US); John O'Hehir, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/897,045

(22) Filed: Jun. 9, 2020

(65) Prior Publication Data

US 2020/0368666 A1 Nov. 26, 2020

Related U.S. Application Data

(63) Continuation of application No. 16/055,929, filed on Aug. 6, 2018, now Pat. No. 10,675,581.

(51) Int. Cl.
*B01D 53/04* (2006.01)
*H01L 21/67* (2006.01)
*H01L 21/673* (2006.01)

(52) U.S. Cl.
CPC ...... *B01D 53/0407* (2013.01); *H01L 21/6715* (2013.01); *H01L 21/67393* (2013.01)

(58) Field of Classification Search
CPC ..... B67C 3/22; B67C 3/222; H01L 21/67393; H01L 21/6715; H01L 21/67017; B01D 53/0407; B01D 53/00; B01D 2258/0216
(Continued)

(56) References Cited

U.S. PATENT DOCUMENTS 3,749,383 A 7/1973 Voigt et al.
3,758,316 A 9/1973 Sowards et al.
(Continued)

FOREIGN PATENT DOCUMENTS

CN 1280875 C 10/2006
CN 101871043 A 10/2010
(Continued)

OTHER PUBLICATIONS

CN-104047676-A English Translation of Specification (Year: 2020).*
(Continued)

*Primary Examiner* — Timothy P. Kelly
*Assistant Examiner* — Stephanie A Shrieves
(74) *Attorney, Agent, or Firm* — Patterson + Sheridan, LLP

(57) ABSTRACT

Embodiments of the present disclosure relate to gas abatement apparatus and effluent management. The apparatus described herein include a high pressure process chamber and a containment chamber surrounding the process chamber. A high pressure fluid delivery module is in fluid communication with the high pressure process chamber and is configured to deliver a high pressure fluid to the process chamber. An effluent management module includes a muffler assembly to effluent pressure reduction and a plurality of scrubbers provide for treatment of effluent.

23 Claims, 3 Drawing Sheets

(58) Field of Classification Search
USPC .......................................................... 141/70
See application file for complete search history.

(56) References Cited

U.S. PATENT DOCUMENTS

| | | | |
|---|---|---|---|
| 4,524,587 A | 6/1985 | Kantor | |
| 4,576,652 A | 3/1986 | Hovel et al. | |
| 4,879,259 A | 11/1989 | Reynolds et al. | |
| 5,050,540 A | 9/1991 | Lindberg | |
| 5,114,513 A | 5/1992 | Hosokawa et al. | |
| 5,126,117 A | 6/1992 | Schumacher et al. | |
| 5,149,378 A | 9/1992 | Ohmi et al. | |
| 5,167,717 A | 12/1992 | Boitnott | |
| 5,175,123 A | 12/1992 | Vasquez et al. | |
| 5,314,541 A | 5/1994 | Saito et al. | |
| 5,319,212 A | 6/1994 | Tokoro | |
| 5,366,905 A | 11/1994 | Mukai | |
| 5,472,812 A | 12/1995 | Sekine | |
| 5,578,132 A | 11/1996 | Yamaga et al. | |
| 5,590,695 A | 1/1997 | Siegele et al. | |
| 5,597,439 A | 1/1997 | Salzman | |
| 5,620,524 A | 4/1997 | Fan et al. | |
| 5,677,230 A | 10/1997 | Weitzel et al. | |
| 5,808,245 A * | 9/1998 | Wiese | F01N 3/281 |
| | | | 181/255 |
| 5,857,368 A | 1/1999 | Grunes et al. | |
| 5,858,051 A | 1/1999 | Komiyama et al. | |
| 5,879,756 A | 3/1999 | Fathi et al. | |
| 5,880,041 A | 3/1999 | Ong | |
| 5,886,864 A | 3/1999 | Dvorsky | |
| 5,940,985 A | 8/1999 | Kamikawa et al. | |
| 6,082,950 A | 7/2000 | Altwood et al. | |
| 6,136,664 A | 10/2000 | Economikos et al. | |
| 6,150,286 A | 11/2000 | Sun et al. | |
| 6,164,412 A * | 12/2000 | Allman | F01N 1/003 |
| | | | 181/272 |
| 6,242,368 B1 | 6/2001 | Holmer et al. | |
| 6,251,751 B1 | 6/2001 | Chu et al. | |
| 6,299,753 B1 | 10/2001 | Chao et al. | |
| 6,319,766 B1 | 11/2001 | Bakli et al. | |
| 6,334,266 B1 | 1/2002 | Moritz et al. | |
| 6,368,412 B1 | 4/2002 | Gomi | |
| 6,442,980 B2 | 9/2002 | Preston et al. | |
| 6,468,490 B1 | 10/2002 | Shamouilian et al. | |
| 6,500,603 B1 | 12/2002 | Shioda | |
| 6,583,497 B2 | 6/2003 | Xia et al. | |
| 6,619,304 B2 | 9/2003 | Worm | |
| 6,797,336 B2 | 9/2004 | Garvey et al. | |
| 6,841,432 B1 | 1/2005 | Takemura et al. | |
| 7,055,333 B2 | 6/2006 | Leitch et al. | |
| 7,084,079 B2 | 8/2006 | Conti et al. | |
| 7,105,061 B1 | 9/2006 | Shrinivasan et al. | |
| 7,111,630 B2 | 9/2006 | Mizobata et al. | |
| 7,114,517 B2 | 10/2006 | Sund et al. | |
| 7,211,525 B1 | 5/2007 | Shanker et al. | |
| 7,282,458 B2 | 10/2007 | Gates et al. | |
| 7,361,231 B2 | 4/2008 | Fury et al. | |
| 7,460,760 B2 | 12/2008 | Cho et al. | |
| 7,491,658 B2 | 2/2009 | Nguyen et al. | |
| 7,503,334 B1 | 3/2009 | Shrinivasan et al. | |
| 7,521,089 B2 | 4/2009 | Hillman et al. | |
| 7,521,378 B2 | 4/2009 | Fucsko et al. | |
| 7,541,297 B2 | 6/2009 | Mallick et al. | |
| 7,576,441 B2 | 8/2009 | Yin et al. | |
| 7,650,965 B2 | 1/2010 | Thayer et al. | |
| 7,651,959 B2 | 1/2010 | Fukazawa et al. | |
| 7,655,532 B1 | 2/2010 | Chen et al. | |
| 7,825,038 B2 | 11/2010 | Ingle et al. | |
| 7,825,042 B2 | 11/2010 | Mandal | |
| 7,867,923 B2 | 1/2011 | Mallick et al. | |
| 7,891,228 B2 | 2/2011 | Ding et al. | |
| 8,027,089 B2 | 9/2011 | Hayashi | |
| 8,318,584 B2 | 11/2012 | Li et al. | |
| 8,349,085 B2 | 1/2013 | Tahara et al. | |
| 8,449,942 B2 | 5/2013 | Li et al. | |
| 8,455,368 B2 | 6/2013 | Chandler et al. | |
| 8,466,073 B2 | 6/2013 | Wang et al. | |
| 8,481,123 B2 | 7/2013 | Kim et al. | |
| 8,536,065 B2 | 9/2013 | Seamons et al. | |
| 8,557,712 B1 | 10/2013 | Antonelli et al. | |
| 8,563,445 B2 | 10/2013 | Liang et al. | |
| 8,647,992 B2 | 2/2014 | Liang et al. | |
| 8,668,868 B2 * | 3/2014 | Chiu | B01D 53/346 |
| | | | 422/62 |
| 8,741,788 B2 | 6/2014 | Liang et al. | |
| 8,871,656 B2 | 10/2014 | Mallick et al. | |
| 8,906,761 B2 | 12/2014 | Kim et al. | |
| 8,936,834 B2 | 1/2015 | Kim et al. | |
| 9,121,515 B2 | 9/2015 | Yamamoto et al. | |
| 9,153,442 B2 | 10/2015 | Wang et al. | |
| 9,157,730 B2 | 10/2015 | Rajagopalan et al. | |
| 9,257,314 B1 | 2/2016 | Rivera et al. | |
| 9,306,026 B2 | 4/2016 | Toriumi et al. | |
| 9,362,107 B2 | 6/2016 | Thadani et al. | |
| 9,382,621 B2 | 7/2016 | Choi et al. | |
| 9,484,406 B1 | 11/2016 | Sun et al. | |
| 9,570,551 B1 | 2/2017 | Balakrishnan et al. | |
| 10,083,834 B2 | 9/2018 | Thompson et al. | |
| 10,096,516 B1 | 10/2018 | Leschkies et al. | |
| 10,179,941 B1 | 1/2019 | Khan et al. | |
| 10,276,411 B2 | 4/2019 | Delmas et al. | |
| 10,529,603 B2 | 1/2020 | Liang et al. | |
| 10,675,581 B2 | 6/2020 | Khan et al. | |
| 10,720,341 B2 | 7/2020 | Liang et al. | |
| 2001/0029108 A1 | 10/2001 | Tometsuka | |
| 2001/0041122 A1 | 11/2001 | Kroeker | |
| 2001/0050096 A1 | 12/2001 | Costantini et al. | |
| 2002/0066535 A1 | 6/2002 | Brown et al. | |
| 2002/0073922 A1 | 6/2002 | Frankel et al. | |
| 2002/0122885 A1 | 9/2002 | Ahn | |
| 2002/0134439 A1 | 9/2002 | Kawasaki et al. | |
| 2002/0148492 A1 | 10/2002 | Yamagata et al. | |
| 2002/0151128 A1 | 10/2002 | Lane et al. | |
| 2002/0155714 A1 | 10/2002 | Suzuki | |
| 2002/0192056 A1 | 12/2002 | Reimer et al. | |
| 2003/0022487 A1 | 1/2003 | Yoon et al. | |
| 2003/0030945 A1 | 2/2003 | Heinonen et al. | |
| 2003/0037730 A1 * | 2/2003 | Yamasaki | C23C 16/45593 |
| | | | 118/715 |
| 2003/0049372 A1 | 3/2003 | Cook et al. | |
| 2003/0053893 A1 | 3/2003 | Matsunaga et al. | |
| 2003/0101938 A1 | 6/2003 | Ronsse et al. | |
| 2003/0121887 A1 | 7/2003 | Garvey et al. | |
| 2003/0148035 A1 | 8/2003 | Lingampalli | |
| 2003/0148631 A1 | 8/2003 | Kuo et al. | |
| 2003/0194615 A1 | 10/2003 | Krauth | |
| 2003/0207593 A1 | 11/2003 | Derderian et al. | |
| 2003/0232512 A1 | 12/2003 | Dickinson et al. | |
| 2004/0007176 A1 * | 1/2004 | Janakiraman | H01L 21/67017 |
| | | | 118/715 |
| 2004/0025908 A1 | 2/2004 | Douglas et al. | |
| 2004/0060519 A1 | 4/2004 | Beauchaine et al. | |
| 2004/0074869 A1 | 4/2004 | Wang et al. | |
| 2004/0112409 A1 | 6/2004 | Schilling | |
| 2004/0184792 A1 | 9/2004 | Hamelin et al. | |
| 2004/0219800 A1 | 11/2004 | Tognetti | |
| 2004/0248392 A1 | 12/2004 | Narwankar et al. | |
| 2004/0255979 A1 | 12/2004 | Fury et al. | |
| 2005/0003655 A1 | 1/2005 | Cathey et al. | |
| 2005/0051194 A1 | 3/2005 | Sakashita et al. | |
| 2005/0082281 A1 | 4/2005 | Uemori et al. | |
| 2005/0136684 A1 | 6/2005 | Mukai et al. | |
| 2005/0161158 A1 * | 7/2005 | Schumacher | B01D 46/24 |
| | | | 156/345.29 |
| 2005/0191828 A1 | 9/2005 | Al-Bayati et al. | |
| 2005/0198971 A1 | 9/2005 | Leitch et al. | |
| 2005/0250347 A1 | 11/2005 | Bailey et al. | |
| 2005/0269291 A1 | 12/2005 | Kent | |
| 2006/0003596 A1 | 1/2006 | Fucsko et al. | |
| 2006/0105107 A1 | 5/2006 | Lindeboom et al. | |
| 2006/0124613 A1 | 6/2006 | Kumar et al. | |
| 2006/0175012 A1 | 8/2006 | Lee | |
| 2006/0176928 A1 * | 8/2006 | Nakamura | H01L 21/6719 |
| | | | 373/60 |

(56) References Cited

U.S. PATENT DOCUMENTS

| | | |
|---|---|---|
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0083109 A1 | 4/2008 | Shibata et al. |
| 2008/0115726 A1 | 5/2008 | Ingle et al. |
| 2008/0121882 A1 | 5/2008 | Hwang et al. |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0315762 A1 | 12/2008 | Hamada et al. |
| 2009/0018688 A1* | 1/2009 | Chandler ............. B01D 53/346 700/105 |
| 2009/0060702 A1* | 3/2009 | Kobayashi ........ H01L 21/67196 414/805 |
| 2009/0081884 A1 | 3/2009 | Yokota et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0072569 A1 | 3/2010 | Han et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0112224 A1 | 5/2012 | Le Bellac et al. |
| 2012/0142192 A1 | 6/2012 | Li et al. |
| 2012/0142198 A1 | 6/2012 | Wang et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0159135 A1 | 6/2014 | Fujimoto et al. |
| 2014/0183743 A1 | 7/2014 | Matsumoto et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmed et al. |
| 2015/0000870 A1* | 1/2015 | Hosotani ............... F28D 1/0213 165/104.19 |
| 2015/0047565 A1* | 2/2015 | Komori ..................... F28B 9/08 118/724 |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1* | 6/2017 | Rebstock ................ B65B 63/08 |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0087418 A1 | 3/2018 | Cadigan et al. |
| 2018/0096874 A1 | 4/2018 | Schaller et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang et al. |

(56) References Cited

U.S. PATENT DOCUMENTS

| | | | |
|---|---|---|---|
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |

FOREIGN PATENT DOCUMENTS

| | | | |
|---|---|---|---|
| CN | 104047676 A | * | 9/2014 |
| CN | 104047676 A | | 9/2014 |
| CN | 104089491 A | | 10/2014 |
| EP | 1107288 A2 | | 6/2001 |
| JP | H1218018 A | | 8/1989 |
| JP | H07048489 B2 | | 5/1995 |
| JP | H08195493 A | | 7/1996 |
| JP | H9296267 A | | 11/1997 |
| JP | H10214880 A | | 8/1998 |
| JP | 2001110729 A | | 4/2001 |
| JP | 2003-51474 A | | 2/2003 |
| JP | 2003166065 A | | 6/2003 |
| JP | 2003188387 A | | 7/2003 |
| JP | 2004-127958 A | | 4/2004 |
| JP | 2005-064269 A | | 3/2005 |
| JP | 2005-333015 A | | 12/2005 |
| JP | 2006526125 A | | 11/2006 |
| JP | 2007242791 A | | 9/2007 |
| JP | 2008-73611 A | | 4/2008 |
| JP | 2008153635 A | | 7/2008 |
| JP | 2009-539231 A | | 11/2009 |
| JP | 2010-205854 A | | 9/2010 |
| JP | 2012-503883 A | | 2/2012 |
| JP | 2012-204656 A | | 10/2012 |
| JP | 2013-105777 A | | 5/2013 |
| JP | 2013516788 A | | 5/2013 |
| JP | 2013-179244 A | | 9/2013 |
| JP | 2014019912 A | | 2/2014 |
| KR | 19980063671 A | | 10/1998 |
| KR | 100422433 B1 | | 7/2004 |
| KR | 20050121750 A | | 12/2005 |
| KR | 20070075383 A | | 7/2007 |
| KR | 20090011463 A | | 2/2009 |
| KR | 1020090040867 A | | 4/2009 |
| KR | 101305904 B1 | | 9/2013 |
| KR | 20140003776 A | | 1/2014 |
| KR | 20140135744 A | | 11/2014 |
| KR | 20150006587 A | | 1/2015 |
| KR | 20150122432 A | | 11/2015 |
| TW | 200529284 A | | 9/2005 |
| TW | 200721316 A | | 6/2007 |
| TW | 201507174 A | | 2/2015 |
| TW | 201608672 A | | 3/2016 |
| TW | 201708597 A | | 3/2017 |
| WO | 2004102055 A1 | | 11/2004 |
| WO | 2008047886 A1 | | 4/2008 |
| WO | 2008/089178 A2 | | 7/2008 |
| WO | 2012/133583 A1 | | 10/2012 |
| WO | 2016065219 A1 | | 4/2016 |

OTHER PUBLICATIONS

Notice of Allowance for U.S. Appl. No. 16/055,929 dated Mar. 30, 2020.
Office Action for U.S. Appl. No. 16/055,929 dated Jan. 22, 2020.
JP-2001110729-A English Translation of Specification (Year: 1999).
International Search Report and Written Opinion for PCT/US2018/043160 dated Jan. 31, 2019.
Shimoyama, Takehiro et al., "Porous Aluminum for Heat Exchanger", Hitachi Chemical, pp. 19-20.
Office Action for Japanese Application No. 2018-517285 dated Oct. 23, 2019.
International Search Report and Written Opinion for PCT/US2019/014759 dated May 14, 2019.
Taiwan Office Action dated Jul. 3, 2019 for Application No. 107136181.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysisof Supercritical Carbon Dioxide Heat Exchangers in Cooling Process", International Refrigeration and Air Conditioning Conference at Purdue, Jul. 17-20, 2006, pp. 1-8.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.
Taiwan Office Action dated Jun. 11, 2019 for Application No. 107138905.
Haskel Pressure on Demand, Pneumatic and Hydraulic Driven Gas Boosters, Apr. 30, 2016, 36 pp.
International Search Report and Written Opinion for PCT/US2018/059676 dated May 23, 2019.
International Search Report and Written Opinion for PCT/US2019/023431 dated Jul. 5, 2019.
Taiwan Office Action dated Jul. 3, 2019 for Application No. 107136151.
International Search Report and Written Opinion for International Application No. PCT/US2019/029602 dated Aug. 14, 2019.
International Search Report and Written Opinion for International Application No. PCT/US2019/040195 dated Oct. 25, 2019.
Taiwan Office Action dated Nov. 19, 2019 for Application No. 108103415.
Office Action for Taiwan Patent Application No. 108111501 dated Nov. 14, 2019.
International Search Report and Written Opinion dated Jan. 31, 2019 for Application No. PCT/US2018/043160.

* cited by examiner

GAS ABATEMENT APPARATUS

CROSS-REFERENCE TO RELATED APPLICATIONS

This application is a continuation of and claims benefit to U.S. patent application Ser. No. 16/055,929, filed Aug. 6, 2018, the entirety of which is hereby incorporated by reference.

BACKGROUND

Field

Embodiments of the present disclosure generally relate to apparatus for semiconductor processing. More specifically, embodiments of the disclosure relate to gas abatement apparatus for high pressure processing systems.

Description of the Related Art

The field of semiconductor manufacturing utilizes various processes to fabricate devices which are incorporated into integrated circuits. As device complexity increases, integrated circuit manufacturers look for improved methodologies to fabricate advanced node devices. For example, advanced processing characteristics may include the utilization of more extreme process variables to enable advanced device fabrication.

One example of a process variable which is increasingly being investigated for utilization in semiconductor manufacturing is high pressure processing. High pressure processing at pressures elevated above atmospheric pressure has shown promising material modulation characteristics. However, apparatus suitable for safely and efficiently performing high pressure processing is often lacking when considering the requisite degree of control desired to perform advanced node device fabrication processes. More specifically, conventional processing apparatus often lack suitable exhaust modules for high pressure management of effluent, such as toxic gases and the like.

Accordingly, what is needed in the art are improved gas abatement apparatus and methods for managing high pressure effluent.

SUMMARY

In one embodiment, a muffler assembly apparatus is provided. The apparatus includes a first muffler defining a first volume therein, the first muffler having a first port formed in a first end and a second port formed in a second end opposite the first port. A second muffler defines a second volume therein. The second muffler has a third port formed in a third end and a fourth port formed in the second muffler substantially opposite the third port. A third muffler defines a third volume therein. The third muffler has a fifth port formed therein and a sixth port formed therein substantially opposite the fifth port. A fourth muffler defines a fourth volume therein. The fourth muffler has a seventh port formed therein and an eighth port formed through a fourth end substantially opposite the seventh port. A first conduit extends between the seventh port and the fifth port and a second conduit extends between the fourth port and the sixth port.

In another embodiment, an effluent management apparatus is provided. The apparatus includes a muffler assembly which includes a first muffler defining a first volume therein, the first muffler having a first port formed in a first end and a second port formed in a second end opposite the first port. A second muffler defines a second volume therein. The second muffler has a third port formed in a third end and a fourth port formed in the second muffler substantially opposite the third port. A third muffler defines a third volume therein. The third muffler has a fifth port formed therein and a sixth port formed therein substantially opposite the fifth port. A fourth muffler defines a fourth volume therein. The fourth muffler has a seventh port formed therein and an eighth port formed through a fourth end substantially opposite the seventh port. A first conduit extends between the seventh port and the fifth port and a second conduit extends between the fourth port and the sixth port. A third conduit extends from the third port to a valve, a first scrubber is in fluid communication with the valve and a second scrubber is in fluid communication with the valve via a fourth conduit.

In yet another embodiment, a high-pressure processing apparatus is provided. The apparatus includes a first chamber and a second chamber defining a process volume therein. The second chamber is disposed within the first chamber. A muffler assembly includes a first muffler defining a first volume therein, the first muffler having a first port formed in a first end and a second port formed in a second end opposite the first port. A second muffler defines a second volume therein. The second muffler has a third port formed in a third end and a fourth port formed in the second muffler substantially opposite the third port. A third muffler defines a third volume therein. The third muffler has a fifth port formed therein and a sixth port formed therein substantially opposite the fifth port. A fourth muffler defines a fourth volume therein. The fourth muffler has a seventh port formed therein and an eighth port formed through a fourth end substantially opposite the seventh port. A first conduit extends between the seventh port and the fifth port and a second conduit extends between the fourth port and the sixth port. A third conduit extends from the third port to a valve, a first scrubber is in fluid communication with the valve and a second scrubber is in fluid communication with the valve via a fourth conduit. A fifth conduit is disposed between the process volume and the first port of the first muffler.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to high pressure processing apparatus for semiconductor processing. The apparatus described herein include a high pressure process chamber and a containment chamber surrounding the process chamber. A high pressure fluid delivery module is in fluid communication with the high pressure process chamber and is configured to deliver a high pressure fluid to the process chamber.

Figure 1:
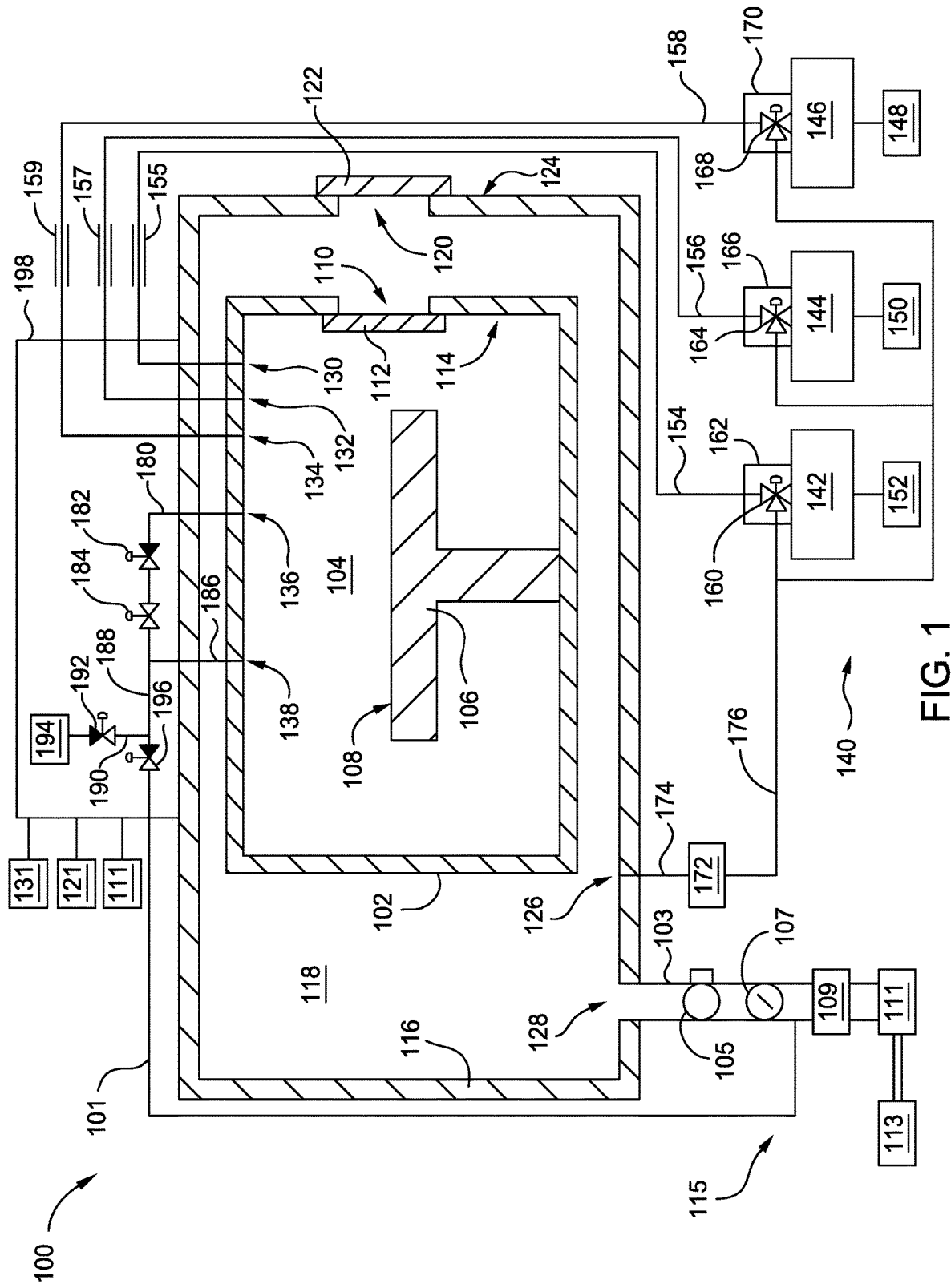
FIG. 1 is a schematic illustration of a high pressure processing apparatus according to an embodiment described herein.

FIG. 1 is a schematic illustration of a high pressure processing apparatus 100 according to an embodiment described herein. The apparatus 100 includes a first chamber 116 which defines a first volume 118 therein. In one embodiment, a volume of the first volume 118 is between about 80 liters and about 150 liters, for example, between about 100 liters and about 120 liters. The first chamber 116 is fabricated from a process compatible material, such as aluminum, stainless steel, alloys thereof, and combinations thereof. The material selected for fabrication of the first chamber 116 is suitable for operation at sub-atmospheric pressures, for example pressures less than about 700 Torr, such as 650 Torr or less.

An effluent management module 115 is coupled to and in fluid communication with the first chamber 116. The first chamber 116 has an exhaust port 128 formed therein. An exhaust conduit 103 is coupled to the first chamber 116 at the exhaust port 128 such that the exhaust conduit 103 is in fluid communication with the first volume 118. An isolation valve 105 and a throttle valve 107 are disposed on the exhaust conduit 103. The isolation valve 105 is disposed on the exhaust conduit 103 between the throttle valve 107 and the exhaust port 128. The isolation valve 105 is operable to initiate and extinguish fluid communication between the first volume 118 and an exhaust 113. The throttle valve 107 controls a flow rate of effluent flowing through the exhaust conduit 103 from the first volume 118.

A pump 109 is also coupled to the exhaust conduit 103 and the pump 109 operates to pull fluid from the first volume 118 to the exhaust 113. The pump 109 is disposed on exhaust conduit 103 between the throttle valve 107 and the exhaust 113. In one embodiment, the pump 109 generates a sub-atmospheric pressure in the first volume 118, such as a pressure less than about 700 Torr. A scrubber 111 is also disposed on the exhaust conduit 103 between the pump 109 and the exhaust 113. The scrubber 111 is in fluid communication with the first volume 118 via the exhaust conduit 103 and the scrubber 111 is configured to treat effluent from the first volume 118 prior to the effluent exiting the exhaust conduit 103 to the exhaust 113.

The first chamber 116 has an external surface 124 which is not exposed to the first volume 118. A first slit valve 120 is formed in the chamber 116 to enable ingress and egress of a substrate therethrough. A first slit valve door 122 is coupled to the external surface 124 adjacent to the first slit valve 120. In operation, the first slit valve door 122 is opened to enable passage of the substrate therethrough and closes prior to processing of the substrate.

A second chamber 102 is disposed within the first volume 118 defined by the first chamber 116. The second chamber 102 defines a second volume 104 therein. Similar to the first chamber 116, the second chamber 102 is fabricated from a process compatible material, such as aluminum, stainless steel, alloys thereof, and combinations thereof. In one embodiment, the second chamber 102 is fabricated from a nickel containing steel alloy, for example, a nickel molybdenum containing steel alloy or a nickel chromium molybdenum containing steel alloy. The material selected for fabrication of the second chamber 102 is suitable for operation of the second volume 104 at high pressures, such as greater than about 30 bar, for example, about 50 bar or greater.

A pedestal 106 is disposed in the second chamber 102 and the pedestal 106 has a substrate support surface 108 for supporting a substrate thereon during processing. In one embodiment, the pedestal 106 includes a resistive heater operable of maintaining a temperature of a substrate disposed on the substrate support surface 108 at a temperature of up to about 550° C. Although not illustrated, a stem of the pedestal 106 extends through the second chamber 102 and the first chamber 116. The stem of the pedestal 106 may be isolated from the first volume 118 by a bellows assembly which is operable isolate the pedestal 106 from the first volume 118.

A second slit valve 110 is formed through the second chamber 102 to enable ingress and egress of the substrate therethrough. The second slit valve 110 is substantially aligned in approximately the same plane as the first slit valve 120. A second slit valve door 112 is coupled to an internal surface 114 of the second chamber 102 adjacent to the second slit valve 110. The positioning of the second slit valve door 112 on the internal surface 114 enables more secure sealing of the second volume 104 during high pressure processing because the high pressure maintained within the second volume 104 urges the second slit valve door 112 against the internal surface 114 to create a substantially air tight seal. In operation, the second slit valve door 112 is opened to enable passage of the substrate from the first slit valve 120. After the substrate is positioned on the substrate support surface 108 of the pedestal 106, the second slit valve door 112 closes prior to processing of the substrate.

A fluid management apparatus 140 is configured to deliver one or more fluids to the second volume 104 of the second chamber 102. The fluid management apparatus 140 includes a first fluid delivery module 144, a second fluid delivery module 142, and a third fluid delivery module 146. The first fluid delivery module 144 is operable to generate steam and deliver steam to the second volume 104. The first fluid delivery module 144 is in fluid communication with a first fluid source 150. In one embodiment, the first fluid source 150 is a water source, and more specifically, a deionized water source. The second fluid delivery module 142 is in fluid communication with a second fluid source 152. In one embodiment, the second fluid source 152 is a hydrogen source, and more specifically, an $H_2$ source. The third fluid delivery module 146 is in fluid communication with a third fluid source 148. In one embodiment, the third fluid source 148 is a nitrogen gas source, for example, an ammonia source.

The first fluid delivery module 144 is in fluid communication with the second volume 104 via a first conduit 156. A valve 164 is disposed between the first fluid delivery module 144 and the first conduit 156. The valve 164 is operable to enable fluid flow from the first fluid delivery module 144 through the first conduit 156. A containment enclosure 166 surrounds the valve 164 and the connections of the valve 164 between the first fluid delivery module 144 and the first conduit 156. The first conduit 156 extends from the first valve 164 through the first chamber 116, the first volume 118, and the second chamber 102 to a port 132 formed on the internal surface 114 of the second chamber 102. In one embodiment, a heater jacket 157 surrounds the first conduit 156 and extends along a length of the first conduit 156 between the valve 164 and the first chamber 116.

The second fluid delivery module 142 is in fluid communication with the second volume 104 via a second conduit 154. A valve 160 is disposed between the second fluid delivery module 142 and the second conduit 154. The valve 160 is operable to enable fluid flow from the second fluid delivery module 142 through the second conduit 154. A containment enclosure 162 surrounds the valve 160 and the connections of the valve 160 between the second fluid delivery module 142 and the second conduit 154. The second conduit 154 extends from the second valve 160 through the first chamber 116, the first volume 118, and the second chamber 102 to a port 130 formed on the internal surface 114 of the second chamber 102. In one embodiment, a heater jacket 155 surrounds the second conduit 154 and extends along a length of the second conduit 154 between the valve 160 and the first chamber 116.

The third fluid delivery module 146 is in fluid communication with the second volume 104 via a third conduit 158. A valve 168 is disposed between the third fluid delivery module 146 and the third conduit 158. The valve 168 is operable to enable fluid flow from the third fluid delivery module 146 through the third conduit 158. A containment enclosure 170 surrounds the valve 168 and the connections of the valve 168 between the third fluid delivery module 146 and the third conduit 158. The third conduit 158 extends from the third valve 168 through the first chamber 116, the first volume 118, and the second chamber 102 to a port 134 formed on the internal surface 114 of the second chamber 102. In one embodiment, a heater jacket 159 surrounds the third conduit 158 and extends along a length of the third conduit 158 between the valve 168 and the first chamber 116.

Each of the heater jackets 155, 157, 159 are operable to maintain a temperature of a respective conduit 154, 156, 158 at about 300° C. or greater, for example. 350° C. or greater. In one embodiment the heater jackets 155, 157, 159 comprise resistive heaters. In another embodiment, the heater jackets 155, 157, 159 comprise fluid channels though which a heated fluid is flowed. By maintaining the conduits 154, 156, 158 at elevated temperatures, steam and other high pressure fluids maintain desirable property characteristics during transfer from the respective fluid delivery modules 142, 144, 146 to the second volume 104. In one example, steam generated in the fluid delivery module 144 is maintained in the conduit 156 at elevated temperatures by the heater jacket 157 to prevent or substantially reduce the probability of condensation during steam transfer.

The apparatus 100 also includes a purge gas source 172. In one embodiment, the purge gas source 172 is an inert gas source, such as a nitrogen source or a noble gas source. The purge gas source 172 is in fluid communication with the first volume 118. A conduit 174 extends from the purge gas source 172 to a port 126 formed in the first chamber 116. The fluid communication between the purge gas source 172 and the first volume 118 enables the first volume 118 to be purged with an inert gas. It is contemplated that the first volume 118 is a containment volume that functions as a failsafe should the second volume 104 experience an unplanned depressurization event. By having a sufficiently large volume to function as an expansion volume and by having purge gas capability, the first volume 118 enables improved safety of operation of the second chamber 102 at elevated pressures.

The purge gas source 172 is also in fluid communication with each of the conduits 156, 154, 158. A conduit 176 extends from the purge gas source 172 to each of the valves 160, 164, 168. When the valves 160, 164, 168 are opened to receive purge gas from the purge gas source 172 flowing through the conduit 176, the conduits 154, 156, 158 are purged to eliminate fluids in the conduits 154, 156, 158 that were previously delivered from the fluid delivery modules 142, 144, 146. The fluid communication between the purge gas source 172 and the conduits 154, 156, 158 also enables purging of the second volume 104.

To remove fluids from the second volume 104, an exhaust port 136 is formed in the second chamber 102. A conduit 180 extends from the exhaust port 136 to a regulator valve 184 which is configured to enable a pressure drop across the regulator valve 184. In one embodiment, pressurized fluid exhausted from the second volume 104 travels through the exhaust port 136, through the conduit 180, and through a valve 182 to the regulator valve 184 where a pressure of the fluid is reduced from greater than about 30 bar, such as about 50 bar, to between about 0.5 bar to about 3 bar. The valve 182 is disposed inline with the regulator valve 184 and enables transfer of the reduced pressure fluid from the conduit 180 to a conduit 188.

A pressure relief port 138 is also formed in the second chamber 102. A conduit 186 extends from the pressure relief port 138 to the conduit 188 and the conduit 186 is coupled to the conduit 188 downstream of the regulator valve 184 and the valve 182. The pressure relief port 138 and conduit 186 are configured to bypass the regulator valve 184 and function as a secondary pressure reduction for the second volume 104. A valve 196 is disposed on the conduit 188 downstream from the conduit 186, the regulator valve 184, and the valve 182. The valve 196 functions to enable fluid flow from the second volume 104 via the pressure relief port 138 without passing through the regulator valve 184. Accordingly, the second volume 104 has a bifurcated pressure relief architecture, first through the exhaust port 136, the conduit 180, and the regulator valve 184, and second, through the pressure relief port 138 and the conduit 186. It is believed that the bifurcated pressure relief architecture enables improved control of the pressures generated in the second volume 104.

A conduit 190 is coupled to and extends from the conduit 188 between the valve 184 and the valve 196. More specifically, the conduit 190 is coupled to the conduit 188 downstream of a location where the conduit 186 is coupled to the conduit 188. A valve 192 is disposed on the conduit 190 and is operable to enable selective fluid communication between the second volume 104 and a steam trap 194. The steam trap 194 is configured to condense steam released from the second volume 104 when high pressure steam processes are performed in the second volume 104. In one embodiment, the steam trap 194 is in fluid communication with the second volume 104 via the conduits 190, 188, and 186 when the valve 192 is opened and the valve 182 is closed. The steam trap 194 may also function as a secondary pressure reduction apparatus for high pressure steam released from the second volume 104.

A containment enclosure 198 is coupled to the first chamber 116 and each of the regulator valve 184, the valve 182, the valve 196, and the valve 192 are disposed within the containment enclosure 198. The conduits 188, 190 are disposed within the containment enclosure 198 and at least a portion of each of the conduits 180, 186 is disposed within the containment enclosure 198. In one embodiment, the steam trap 194 is disposed within the containment enclosure 198. In another embodiment, the steam trap 194 is disposed outside of the containment enclosure 198.

A sensor 121 is coupled to the containment enclosure 198 and in fluid communication with the volume defined within the containment enclosure 198. The sensor 121 is configured to detect leakage of a gas within the containment enclosure volume. In one embodiment, the sensor 121 is an ammonia detector. In another embodiment, the sensor 121 is a hydrogen detector. In certain embodiments, the sensor 121 includes multiple sensors, for example, an ammonia detector and a hydrogen detector. The containment enclosure 198 is configured to isolate and contain any leakage of effluent exhausted from the second volume 104. If leakage of effluent, such as the gases described above, is detected, the volume defined by the containment enclosure 198 is purged by an inert gas from a gas source 131. In one embodiment, the gas source 131 is configured to deliver nitrogen to the volume defined by the containment enclosure 198. Effluent leaked into the volume is exhausted from the containment enclosure 198. In this embodiment, the containment enclosure 198 volume is in fluid communication with the scrubber 111 to enable treatment of effluent constrained within the containment enclosure 198 when the effluent is exhausted from the containment enclosure 198.

When the valve 196 is opened, fluid from the conduit 188 travels to a conduit 101 which is in fluid communication with the effluent management module 115. The effluent management module 115, which treats and manages exhaust from both of the first volume 118 and the second volume 104, is described in greater detail with regard to FIG. 2.

Figure 2:
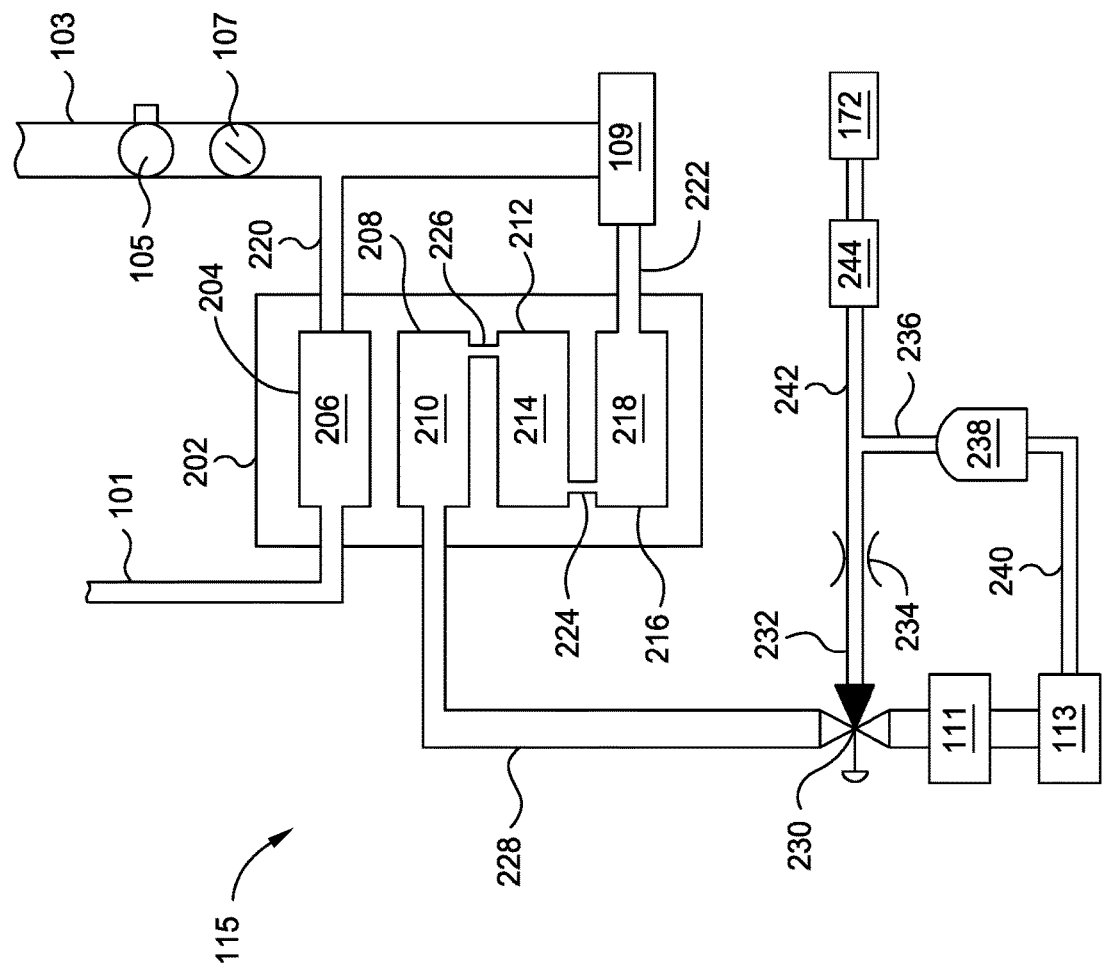
FIG. 2 is a schematic illustration of an effluent management module according to an embodiment described herein.

FIG. 2 is a schematic illustration of the effluent management module 115 according to an embodiment described herein. The module 115 includes the exhaust conduit 103, the isolation valve 105, the throttle valve 107, the pump 109, the scrubber 111, and the exhaust 113 as described above with regard to FIG. 1. The module 115 also includes a muffler assembly 202. The muffler assembly 202 is in fluid communication with the second volume 104 via the conduit 101. The muffler assembly 202 includes a plurality of mufflers 204, 208, 212, 216 which are operable to reduce a pressure of effluent flowing through the muffler stack 202.

The muffler assembly 202 includes a first muffler 204 which defines a volume 206, a second muffler 208 which defines a volume 210, a third muffler 212 which defined a volume 214, and a fourth muffler 216 which defines a volume 218. The conduit 101 is coupled to and extends between the valve 196 and the first muffler 204. A conduit 220 extends from the first muffler 204 opposite the conduit 101 to the exhaust conduit 103. The conduit 220 is coupled to the exhaust conduit 103 between the throttle valve 107 and the pump 109.

A conduit 222 extends from the pump 109 to the fourth muffler 216. A conduit 224 extends between the fourth muffler 216 and the third muffler 212. A conduit 226 extends between the third muffler 212 and the second muffler 208. In operation, effluent flowing through the conduit 101 enters the volume 206 of the first muffler 204 and flows through the volume 206 to the conduit 220. A pressure of the effluent within the conduit is between about 15 psi and about 30 psi. The pressure of the effluent exiting the volume 206 at the conduit 220 is between about 0 psi and about 5 psi. Thus, the first muffler 204 functions as a pressure reduction apparatus which allows the effluent to experience volumetric expansion to reduce the pressure of the effluent.

The effluent continues from the conduit 220 through the exhaust conduit 103 to the pump 109. In some embodiments, effluent from the first volume 118 is also present in the exhaust conduit should effluent escape from the second volume 104 into the first volume 118. The pump 109 increases a pressure of the effluent to less than about 16.5 psi, such as between about 5 psi and about 15 psi, to move the effluent through the remainder of the muffler assembly 202. The pump pressurized effluent travels through the conduit 222 to the fourth muffler 216 and expands in the volume 218. The effluent then flows from the volume 218 through the conduit 224 to the volume 214 of the third muffler 212. The volume 214 further reduces the pressure of the effluent and the effluent travels from the volume 214 through the conduit 226 to the volume 210 of the second muffler 208. The volume 210 further reduces the pressure of the effluent such that when the effluent leaves the volume 210 the effluent has a pressure of less than about 14.5 psi, such as less than about 10 psi, for example, between about 0 psi and about 5 psi.

The effluent exits the volume 210 through a conduit 228 which is coupled to and in fluid communication with the volume 210. The conduit 228 extends from the second muffler 208 to a bypass valve 230. During normal operation, the bypass valve 230 enables fluid flow from the conduit 228 to the scrubber 111 and exhaust 113. However, should an apparatus failure occur which results in an unplanned or uncontained release of effluent, pressurized or not, the bypass valve 230 is opened which enables fluid flowing through the module 115 to enter the conduit 232 rather than flowing to the scrubber 111. The bypass valve 230 is also opened when the scrubber 111 fails to prevent release of untreated effluent to the exhaust 113.

The conduit 232 has a flow restrictor 234 disposed thereon which reduces a flow of effluent traveling through the conduit 232. In one embodiment, an amount of $NH_3$ flowing through the conduit 232 is modulate by the flow restrictor 234 such that the concentration of $NH_3$ is less than about 5% by volume, such as less than about 2% by volume. To further facilitate concentration reduction of the $NH_3$, the purge gas source 172 is also in fluid communication with the conduit 232 via a conduit 242. A mass flow controller 244 controls the amount of purge gas, such as nitrogen, flowing from the purge gas source 172 through the conduit 242 such that the effluent in the conduit 232 is mixed with an appropriate amount of purge gas before the effluent travels through a conduit 236 to a second scrubber 238.

The conduit 236 tees from the intersection of the conduits 232, 242 and extends to the second scrubber 238. The second scrubber 238 treats the effluent when the bypass valve 230 is opened and the effluent $NH_3$ concentration is modulated to an acceptable amount for treatment. After treatment in the second scrubber 238, the treated effluent travels through a conduit 240 which is in fluid communication between the second scrubber 238 and the exhaust 113.

Figure 3:
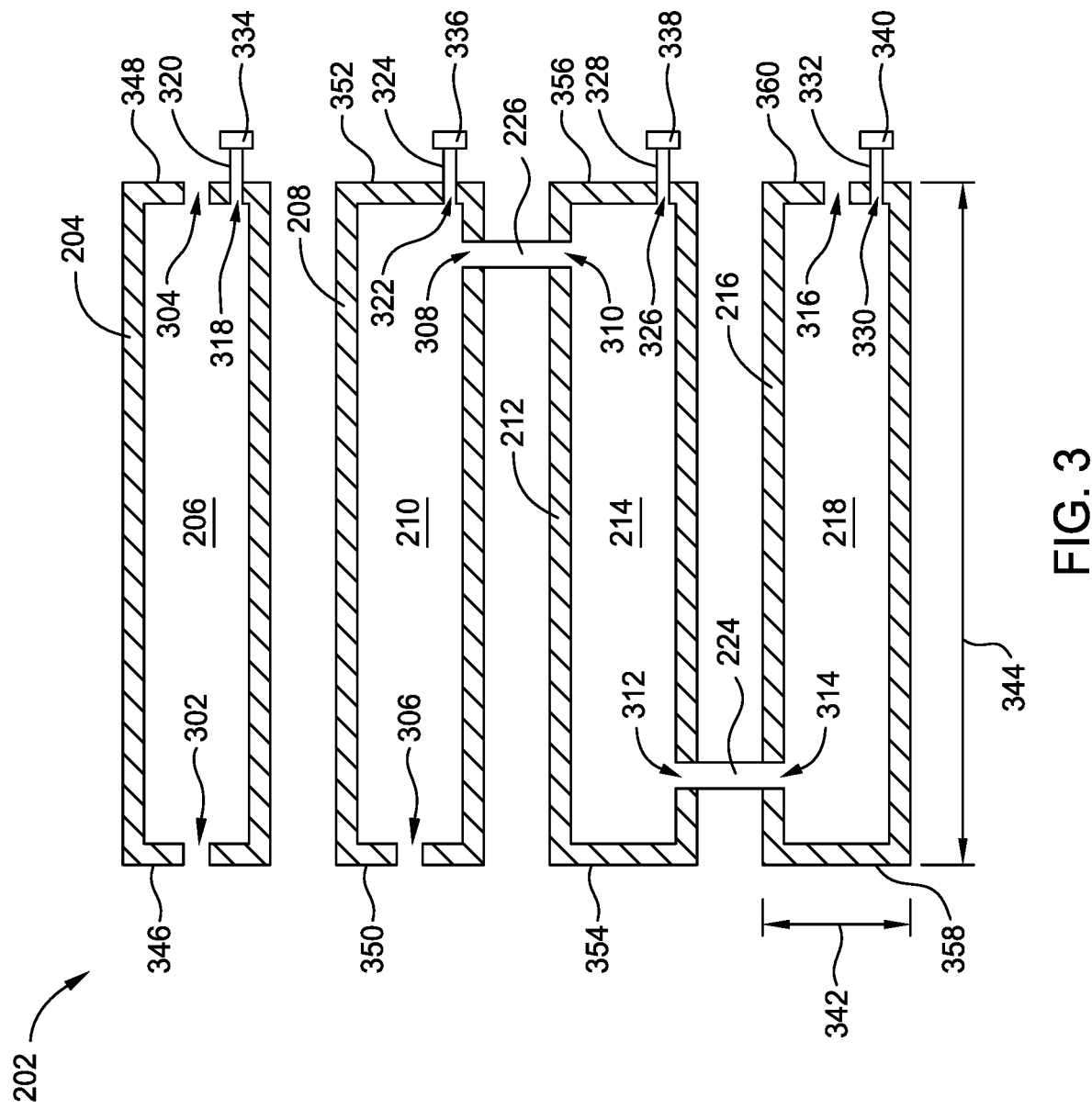
FIG. 3 is a schematic, cross-sectional illustration of a muffler assembly according to an embodiment described herein.

FIG. 3 is a schematic, cross-sectional illustration of the muffler assembly 202 according to an embodiment described herein. As described above, the muffler assembly 202 includes the plurality of mufflers 204, 208, 212, 216. In one embodiment, the mufflers 204, 208, 212, 216 are fabricated from a stainless steel material or alloys thereof. In another embodiment, the mufflers 204, 208, 212, 216 are fabricated from an aluminum material or alloys thereof. Each of the mufflers 204, 208, 212, 216 defines a respective volume 206, 210, 124, 218 therein. In one embodiment, each of the mufflers 204, 208, 212, 216 have substantially similar dimensions.

In one embodiment, the muffler 204, 208, 212, 216 are cylindrical. A diameter 342 of each of the mufflers 204, 208, 212, 216 is between about 20 inches and about 40 inches, for example, about 30 inches. A length 344 of each of the mufflers 204, 208, 212, 216 is between about 60 inches and about 100 inches, such as about 80 inches. In one embodiment, the mufflers 204, 208, 212, 216 are stacked in a substantially vertical arrangement. In one embodiment, the mufflers 204, 208, 212, 216 are structured by a frame assembly (not shown) to facilitate disposition in the substantially vertical arrangement. It is also contemplated that the mufflers 204, 208, 212, 216 may be disposed in a horizontal arrangement or other arrangements.

The first muffler 204 has a port 302 formed through a first end 346. In one embodiment, the port 302 is formed through a center region of the first end 346. The conduit 101 couples to the port 302 to enable fluid communication between the conduit 101 and the volume 206. A port 304 is formed through a second end 348 of the first muffler 204 opposite the port 302. In one embodiment, the port 304 is formed through a center region of the second end 348. In operation, effluent enters the volume 206 through the port 302 and exits the volume 206 through the port 304. The conduit 220 is coupled to the port 304 to enable fluid communication between the volume 206 and the exhaust conduit 103.

As described above, effluent from the second volume 104 flows sequentially through the first muffler 204, the fourth muffler 216, the third muffler 212, and the second muffler 208. A port 316 is formed in a second end 360 of the fourth muffler 216. The conduit 222 is coupled to the port 316 to enable fluid communication between the pump 109 and the volume 218. A port 314 is formed through the fourth muffler 216 adjacent to a first end 358 of the fourth muffler 216 opposite the port 316. In operation, effluent enters the volume 218 through the port 316 and exits the volume 218 through the port 314.

In the aforementioned embodiment, the sequential flow of effluent proceeds from the first muffler 204 to the fourth muffler 216, the third muffler 212, and the second muffler 208. In this embodiment, the volume 218 of the fourth muffler 216 is in direct fluid communication with the volume 214 of the third muffler 212. Similarly, the volume 214 of the third muffler 212 is in direct fluid communication with the volume 210 of the second muffler 208. The volume 206 of the first muffler 204 is in indirect fluid communication with the volume 218 of the fourth muffler 216 via the exhaust conduit 103. In alternative embodiments, the direct and indirect fluid communication between the various volumes 206, 210, 214, 218 may be varied depending upon the desired effluent pressure reduction and/or physical space requirements.

A port 312 is formed in the third muffler 212 adjacent to a first end 354 of the third muffler 212. A conduit 224 extends between the port 312 and the port 314 to enable fluid communication between the volume 218 and the volume 214. A port 310 is formed in the third muffler 212 adjacent to a second end 356 of the third muffler 212 opposite the port 312. In operation, effluent enters the volume 214 through the port 312 and exits the volume 214 through the port 310.

A port 308 is formed in the second muffler 208 adjacent to a second end 352 of the second muffler 208. A conduit 226 extends between the port 308 and the port 310 to enable fluid communication between the volume 214 and the volume 210. A port 306 is formed in the second muffler 208 through a first end 350 of the second muffler opposite the port 308. In one embodiment, the port 306 is formed through a center region of the first end 350. In operation, effluent enters the volume 210 through the port 308 and exits the volume 210 through the port 306. The conduit 228 is coupled to the port 306 to remove effluent from the volume 210 and transfer the effluent to other apparatus of the module 115.

Each of the mufflers 204, 208, 212, 216 and the respective fluid inlet and outlet ports are disposed opposite one another along the length 344 of the mufflers 204, 208, 212, 216 to enable volumetric expansion of the effluent as the effluent traverses through the volumes 206, 210, 214, 218. By enabling the effluent to "see" substantially the entire volume of each of the mufflers 204, 208, 212, 216 pressure reduction is accomplished in a more efficient manner.

When the effluent travels through the mufflers 204, 208, 212, 216, condensate or other liquids may accumulate within the volumes 206, 210, 214, 218. A port 318 is formed through the second end 348 of the first muffler 204 adjacent to the port 304. In one embodiment, the port 318 is formed through the second end 348 radially outward of the port 304. A conduit 320 is coupled to and extends from the port 318 to a cap 334. When condensate or other fluid accumulates within the volume 206, the cap 334 is removed and the fluid is evacuated from the volume 206 via the port 318 and conduit 320.

A port 322 is formed through the second end 352 of the second muffler 208. In one embodiment, the port 322 is formed through the second end 352 radially outward of the port 306. A conduit 324 is coupled to and extends from the port 322 to a cap 336. When condensate or other fluid accumulates within the volume 210, the cap 336 is removed and the fluid is evacuated from the volume 210 via the port 322 and conduit 324.

A port 326 is formed through the second end 356 of the third muffler 212. A conduit 328 is coupled to and extends from the port 326 to a cap 338. When condensate or other fluid accumulates within the volume 214, the cap 338 is removed and the fluid is evacuated from the volume 214 via the port 326 and conduit 328.

A port 330 is formed through the second end 360 of the fourth muffler 216 adjacent to the port 316. In one embodiment, the port 330 is formed through the second end 360 radially outward of the port 316. A conduit 332 is coupled to and extends from the port 330 to a cap 340. When condensate or other fluid accumulates within the volume 218, the cap 340 is removed and the fluid is evacuated from the volume 218 via the port 330 and conduit 332.

In summation, effluent management apparatus for improving pressure reduction of effluent and for treating effluent are described herein. The muffler assembly enables pressure reduction of effluent utilized during high pressure processing operation by sequentially flowing the effluent through a series of mufflers to enable volumetric expansion (and associated pressure reduction) of the effluent. Apparatus described herein also include effluent treatment apparatus for standard operation and high pressure processing apparatus and for emergency effluent control in the case of an unplanned or uncontained effluent release.

While the foregoing is directed to embodiments of the present disclosure, other and further embodiments of the disclosure may be devised without departing from the basic scope thereof, and the scope thereof is determined by the claims that follow.

What is claimed is:
1. A muffler assembly apparatus, comprising:
  a first muffler defining a first volume therein, the first muffler having a first port formed in a first end and a second port formed in a second end opposite the first port;

a second muffler defining a second volume therein, the second muffler having a third port formed in a third end and a fourth port formed in the second muffler opposite the third port;
a third muffler defining a third volume therein, the third muffler having a fifth port formed therein and a sixth port formed therein opposite the fifth port;
a fourth muffler defining a fourth volume therein, the fourth muffler having a seventh port formed therein and an eighth port formed through a fourth end opposite the seventh port;
a first conduit extending between the seventh port and the fifth port;
a second conduit extending between the fourth port and the sixth port;
an exhaust conduit;
a pump coupled to the exhaust conduit;
a third conduit extending from the first muffler to the exhaust conduit; and
a fourth conduit extending from the pump to the fourth muffler.

2. The apparatus of claim 1, wherein the each of the first muffler, the second muffler, the third muffler, and the fourth muffler have similar dimensions.

3. The apparatus of claim 2, wherein a length of each of the first muffler, the second muffler, the third muffler, and the fourth muffler is between 60 inches and 100 inches.

4. The apparatus of claim 2, wherein each of the first muffler, the second muffler, the third muffler, and the fourth muffler are cylindrical.

5. The apparatus of claim 4, wherein a diameter of each of the first muffler, the second muffler, the third muffler, and the fourth muffler is between 20 inches and 40 inches.

6. The apparatus of claim 1, further comprising:
a ninth port formed in the first muffler adjacent to the second port;
a tenth port formed in the second muffler adjacent to the fourth port;
an eleventh port formed in the third muffler adjacent to the sixth port; and
a twelfth port formed in the fourth muffler adjacent to the eighth port.

7. An effluent management apparatus, comprising:
a muffler assembly, comprising:
a first muffler defining a first volume therein;
a second muffler defining a second volume therein;
a third muffler defining a third volume therein;
a fourth muffler defining a fourth volume therein;
a first conduit extending between the fourth muffler and the third muffler; and
a second conduit extending between the second muffler and the third muffler;
a valve;
a third conduit extending between the second muffler and the valve;
a first scrubber in fluid communication with the valve; and
a second scrubber in fluid communication with the valve via a fourth conduit, wherein a flow restrictor is disposed on the fourth conduit between the valve and the second scrubber.

8. The apparatus of claim 7, wherein each of the first muffler, the second muffler, the third muffler, and the fourth muffler is cylindrical.

9. The apparatus of claim 8, wherein a length of each of the first muffler, the second muffler, the third muffler, and the fourth muffler is between 60 inches and 100 inches.

10. The apparatus of claim 8, wherein a diameter of each of the first muffler, the second muffler, the third muffler, and the fourth muffler is between 20 inches and 40 inches.

11. A high-pressure processing apparatus, comprising:
a first chamber;
a second chamber defining a process volume therein, the second chamber disposed within the first chamber;
a muffler assembly, comprising:
a first muffler defining a first volume therein;
a second muffler defining a second volume therein;
a third muffler defining a third volume therein;
a fourth muffler defining a fourth volume therein;
a first conduit extending between the fourth muffler and the third muffler; and
a second conduit extending between the second muffler and the third muffler;
a valve;
a third conduit extending between the second muffler and the valve;
a first scrubber in fluid communication with the valve;
an exhaust conduit extending from the first chamber;
a pump coupled to the exhaust conduit;
a fourth conduit extending from the first muffler to the exhaust conduit; and
a fifth conduit extending from the pump to the fourth muffler.

12. The apparatus of claim 11, further comprising:
a second scrubber in fluid communication with the valve via a sixth conduit; and
a seventh conduit disposed between the process volume and the first muffler.

13. The apparatus of claim 11, wherein each of the first muffler, the second muffler, the third muffler, and the fourth muffler is cylindrical.

14. The apparatus of claim 13, wherein a length of each of the first muffler, the second muffler, the third muffler, and the fourth muffler is between 60 inches and 100 inches.

15. The apparatus of claim 13, wherein a diameter of each of the first muffler, the second muffler, the third muffler, and the fourth muffler is between 20 inches and 40 inches.

16. The apparatus of claim 11, further comprising:
a first slit valve formed in the second chamber; and
a first slit valve door coupled to an internal surface of the second chamber.

17. The apparatus of claim 16, further comprising:
a second slit valve formed in the first chamber; and
a second slit valve door coupled to an external surface of the first chamber.

18. An effluent management apparatus, comprising:
a muffler assembly, comprising:
a first muffler defining a first volume therein;
a second muffler defining a second volume therein;
a third muffler defining a third volume therein;
a fourth muffler defining a fourth volume therein;
a first conduit extending between the fourth muffler and the third muffler; and
a second conduit extending between the second muffler and the third muffler;
a valve;
a third conduit extending between the second muffler and the valve;
a first scrubber in fluid communication with the valve;
an exhaust conduit;
a pump coupled to the exhaust conduit;
a fourth conduit extending from the first muffler to the exhaust conduit; and a fifth conduit extending from the pump to the fourth muffler.

19. The apparatus of claim 18, wherein each of the first muffler, the second muffler, the third muffler, and the fourth muffler is cylindrical.

20. The apparatus of claim 19, wherein a length of each of the first muffler, the second muffler, the third muffler, and the fourth muffler is between 60 inches and 100 inches.

21. The apparatus of claim 19, wherein a diameter of each of the first muffler, the second muffler, the third muffler, and the fourth muffler is between 20 inches and 40 inches.

22. A high-pressure processing apparatus, comprising:
a first chamber;
a second chamber defining a process volume therein, the second chamber disposed within the first chamber;
a muffler assembly, comprising:
   a first muffler defining a first volume therein;
   a second muffler defining a second volume therein;
   a third muffler defining a third volume therein;
   a fourth muffler defining a fourth volume therein;
   a first conduit extending between the fourth muffler and the third muffler; and
   a second conduit extending between the second muffler and the third muffler;
a valve;
a third conduit extending between the second muffler and the valve;
a first scrubber in fluid communication with the valve;
a first slit valve formed in the second chamber; and
a first slit valve door coupled to an internal surface of the second chamber.

23. A high-pressure processing apparatus, comprising:
a first chamber;
a second chamber defining a process volume therein, the second chamber disposed within the first chamber;
a muffler assembly, comprising:
   a first muffler defining a first volume therein;
   a second muffler defining a second volume therein;
   a third muffler defining a third volume therein;
   a fourth muffler defining a fourth volume therein;
   a first conduit extending between the fourth muffler and the third muffler; and
   a second conduit extending between the second muffler and the third muffler;
a valve;
a third conduit extending between the second muffler and the valve;
a first scrubber in fluid communication with the valve;
a first slit valve formed in the first chamber; and
a first slit valve door coupled to an external surface of the first chamber.

\* \* \* \* \*